United States Patent
Melanson

(10) Patent No.: US 11,239,857 B2
(45) Date of Patent: Feb. 1, 2022

(54) CALIBRATION OF DIGITAL-TO-ANALOG CONVERTER WITH LOW PIN COUNT

(71) Applicant: Cirrus Logic International Semiconductor Ltd., Edinburgh (GB)

(72) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/943,156

(22) Filed: Jul. 30, 2020

(65) Prior Publication Data

US 2021/0175898 A1 Jun. 10, 2021

Related U.S. Application Data

(60) Provisional application No. 62/944,646, filed on Dec. 6, 2019.

(51) Int. Cl.
  *H03M 1/10* (2006.01)
  *H03M 3/00* (2006.01)
  *H04R 3/00* (2006.01)

(52) U.S. Cl.
  CPC ............. *H03M 3/50* (2013.01); *H03M 3/378* (2013.01); *H03M 3/38* (2013.01); *H04R 3/00* (2013.01)

(58) Field of Classification Search
  CPC .......... H03M 3/50; H03M 3/378; H03M 3/38; H04R 3/00
  USPC .......................... 341/118, 120, 143, 144, 155
  See application file for complete search history.

(56) References Cited

U.S. PATENT DOCUMENTS 6,449,569 B1 9/2002 Melanson
2013/0057342 A1* 3/2013 Zhu ....................... H03F 1/0222
                                                               330/127

* cited by examiner

*Primary Examiner* — Peguy Jean Pierre
(74) *Attorney, Agent, or Firm* — Jackson Walker L.L.P.

(57) ABSTRACT

An open-loop digital-to-analog converter (DAC) circuit may include a delta-sigma modulator, a decode block responsive to the delta-sigma modulator configured to perform a DAC decode operation, a plurality of DAC elements responsive to the DAC decode operation, an analog output driver responsive to the plurality of DAC elements, a test signal generator configured to generate a test signal that is responsive to inputs of the plurality of DAC elements, and a synchronizer configured to enable replication of the test signal at an external test system coupled to the open-loop DAC circuit in order to generate a matching test signal at the external test system that matches the test signal generated by the test signal generator.

18 Claims, 2 Drawing Sheets

CALIBRATION OF DIGITAL-TO-ANALOG CONVERTER WITH LOW PIN COUNT

RELATED APPLICATION

The present disclosure claims priority to U.S. Provisional Patent Application Ser. No. 62/944,646, filed Dec. 6, 2019, which is incorporated by reference herein in its entirety.

FIELD OF DISCLOSURE

The present disclosure relates in general to circuits for audio devices, including without limitation personal audio devices, such as wireless telephones and media players, and more specifically, to systems and methods relating to calibrating a digital-to-analog converter having a low pin count.

BACKGROUND

Mobile devices, including wireless telephones, such as mobile/cellular telephones, cordless telephones, mp3 players, and other consumer audio devices, are in widespread use. Such mobile devices may include circuitry for driving a transducer, including without limitation, a headphone, a speaker, a linear resonant actuator or other vibrational actuator, and/or any other suitable transducer.

In many instances, a transducer may be driven by a signal path that includes an open-loop digital-to-analog converter (DAC). However, such an open-loop DAC circuit may be susceptible to distortion and may require calibration to correct for such distortion. Calibration of such an open-loop DAC circuit requires outputting the various signals from the DAC elements to an external system (e.g., a test system) to be able to compare and synchronize them to a reference signal or reference value to compensate for noise. However, such a task for outputting multiple DAC element signals for a DAC circuit that is integral to an integrated circuit (IC) may be very challenging, especially when only a limited or low number of pins for outputting such values may exist on the IC.

For example, U.S. Pat. No. 6,449,569 (hereafter referred to as "the '569 patent") discloses systems and methods for using correlation of signals to calibrate a DAC, for example by determining the weights of DAC elements of a DAC. The '569 patent is hereby incorporated by reference herein in its entirety. The technique set forth in the '569 Patent requires the calibration circuitry to have knowledge of the signal driving each individual DAC element. Such requirement may be problematic on a low pin-count IC. For example, in an audio DAC, there may be thirty-two (32) DAC element drive signals to input to the correlation and calibration process, and providing output pins on an IC for all such drive signals may be impractical.

SUMMARY

In accordance with the teachings of the present disclosure, one or more disadvantages and problems associated with existing approaches to calibrating a digital-to-analog converter may be reduced or eliminated.

In accordance with embodiments of the present disclosure, an open-loop digital-to-analog converter (DAC) circuit may include a delta-sigma modulator, a decode block responsive to the delta-sigma modulator configured to perform a DAC decode operation, a plurality of DAC elements responsive to the DAC decode operation, an analog output driver responsive to the plurality of DAC elements, a test signal generator configured to generate a test signal that is responsive to inputs of the plurality of DAC elements, and a synchronizer configured to enable replication of the test signal at an external test system coupled to the open-loop DAC circuit in order to generate a matching test signal at the external test system that matches the test signal generated by the test signal generator.

In accordance with these and other embodiments of the present disclosure, a method may include, in an open-loop digital-to-analog converter (DAC) circuit having a delta-sigma modulator, a decode block responsive to the delta-sigma modulator configured to perform a DAC decode operation, a plurality of DAC elements responsive to the DAC decode operation, and an analog output driver responsive to the plurality of DAC elements: generating a test signal that is responsive to inputs of the plurality of DAC elements and enabling replication of the test signal at an external test system coupled to the open-loop DAC circuit in order to generate a matching test signal at the external test system that matches the test signal generated by the test signal generator.

In accordance with these and other embodiments of the present disclosure, an external test system may be described for an open-loop digital-to-analog converter (DAC) circuit having a delta-sigma modulator, a decode block responsive to the delta-sigma modulator configured to perform a DAC decode operation, a plurality of DAC elements responsive to the DAC decode operation, an analog output driver responsive to the plurality of DAC elements, a test signal generator configured to generate a test signal that is responsive to inputs of the plurality of DAC elements, and a synchronizer configured to enable replication of the test signal at an external test system coupled to the open-loop DAC circuit in order to generate a matching test signal at the external test system that matches the test signal generated by the test signal generator, wherein the external test system comprises a matched delta-sigma modulator matched to the delta-sigma modulator and responsive to the matching test signal and a matched decode block matched to the decode block and responsive to the matched delta-sigma modulator and configured to perform a second DAC decode operation matched to the DAC decode operation.

In accordance with these and other embodiments of the present disclosure, a method may be described for an external test system for an open-loop digital-to-analog converter (DAC) circuit having a delta-sigma modulator, a decode block responsive to the delta-sigma modulator configured to perform a DAC decode operation, a plurality of DAC elements responsive to the DAC decode operation, an analog output driver responsive to the plurality of DAC elements, a test signal generator configured to generate a test signal that is responsive to inputs of the plurality of DAC elements, and a synchronizer configured to enable replication of the test signal at an external test system coupled to the open-loop DAC circuit in order to generate a matching test signal at the external test system that matches the test signal generated by the test signal generator, wherein the method comprises matching a matched delta-sigma modulator to the delta-sigma modulator and responsive to the matching test signal and matching a matched decode block to the decode block and responsive to the matched delta-sigma modulator and configured to perform a second DAC decode operation matched to the DAC decode operation.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
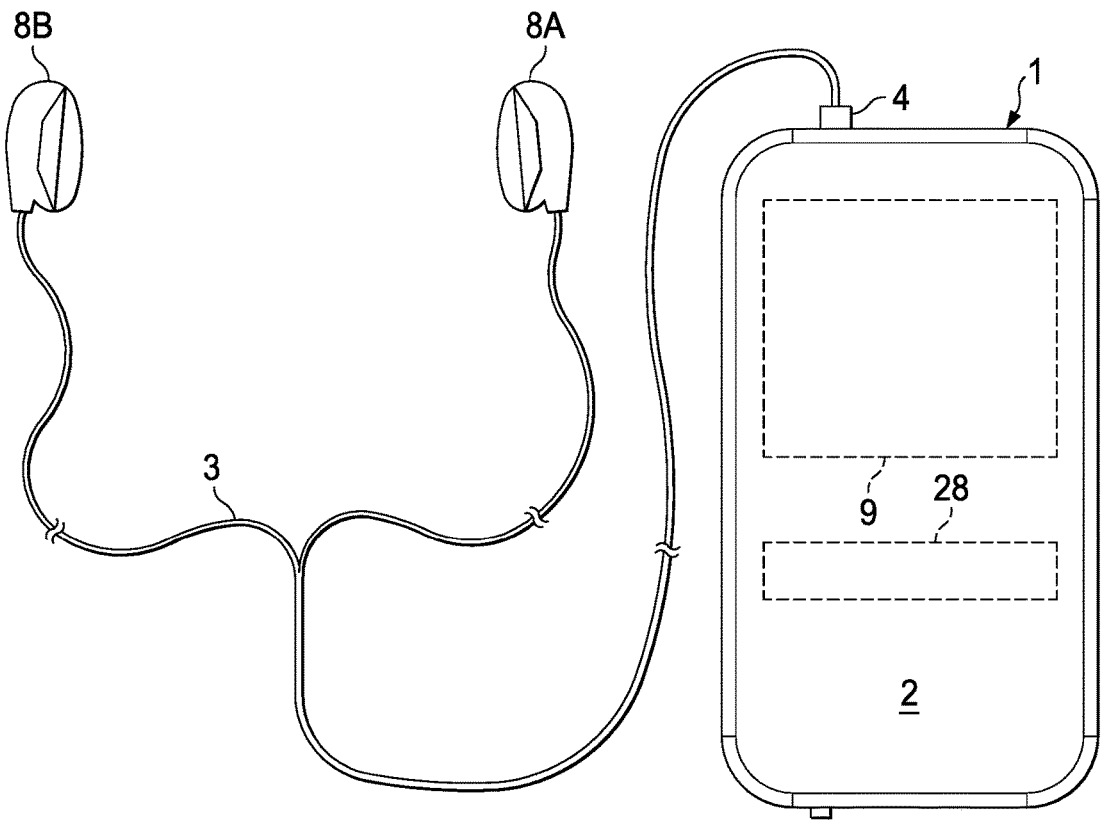
FIG. 1 is an illustration of an example mobile device, in accordance with embodiments of the present disclosure.

FIG. 1 is an illustration of an example mobile device 1, in accordance with embodiments of the present disclosure. FIG. 1 depicts mobile device 1 coupled to a headset 3 in the form of a pair of earbud speakers 8A and 8B. Headset 3 depicted in FIG. 1 is merely an example, and it is understood that mobile device 1 may be used in connection with a variety of audio transducers, including without limitation, headphones, earbuds, in-ear earphones, and external speakers. A plug 4 may provide for connection of headset 3 to an electrical terminal of mobile device 1. Mobile device 1 may provide a display to a user and receive user input using a touch screen 2, or alternatively, a standard liquid crystal display (LCD) may be combined with various buttons, sliders, and/or dials disposed on the face and/or sides of mobile device 1. As also shown in FIG. 1, mobile device 1 may include an integrated circuit (IC) 9 for generating an analog signal for transmission to headset 3 and/or another transducer. As further shown in FIG. 1, mobile device 1 may include a calibration subsystem external to IC 9, configured to perform calibration as described in greater detail below.

Figure 2:
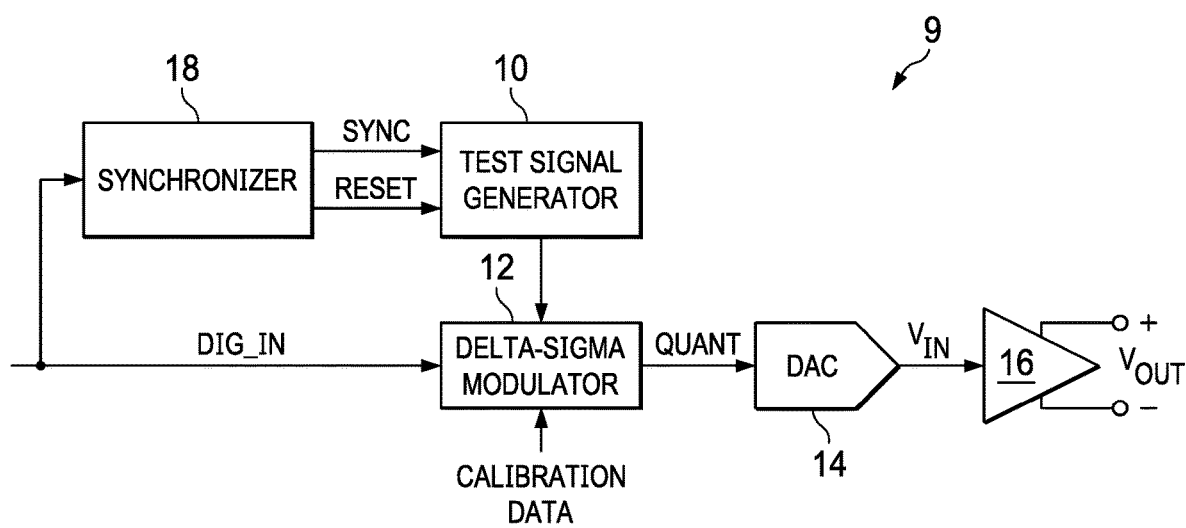
FIG. 2 is a block diagram of selected components of an example audio IC of a mobile device, in accordance with embodiments of the present disclosure.

FIG. 2 is a block diagram of selected components of an example IC 9 of a mobile device, in accordance with embodiments of the present disclosure. In some embodiments, example IC 9 may be used to implement IC 9 of FIG. 1. As shown in FIG. 2, IC 9 may receive a digital input signal DIG_IN to a digital delta-sigma modulator 12, which may convert it to a quantized (e.g., six-bit) signal QUANT at a sampling rate much higher than that of digital audio input signal DIG_IN (e.g., digital input signal DIG_IN may have a sampling rate of approximately 44 KHz and quantized signal QUANT may have a sampling rate of 1.6 MHz). As described in greater detail below, delta-sigma modulator 12 may also receive, from a calibration subsystem external to IC 9, calibration data for calibrating delta-signal modulator 12 to account for any noise and/or distortion in the open-loop DAC signal path shown in FIG. 2.

Figure 3:
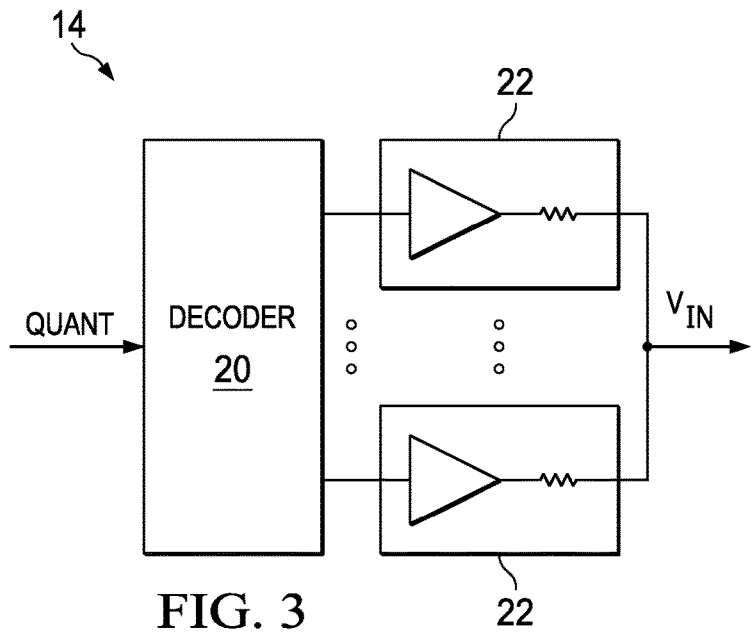
FIG. 3 is a block diagram of selected components of an example DAC, in accordance with embodiments of the present disclosure.

Digital-to-analog converter (DAC) 14 may receive quantized signal QUANT which may convert quantized signal QUANT to an analog input signal $V_{IN}$. Turning briefly to FIG. 3, depicted is a block diagram of selected components of an example DAC 14, in accordance with embodiments of the present disclosure. Example DAC 14 depicted in FIG. 3 is a thermometer-coded DAC, comprising a decoder 20 configured to decode quantized signal QUANT to a thermometer coded output and a plurality of DAC elements 22, each of which may be weighted according to the magnitude of the corresponding bit represented in the thermometer-coded output of decoder 20, such that each DAC element 22 generates, when its corresponding bit of the thermometer-coded output of decoder 20 is asserted, an analog signal equivalent in value to the magnitude of its corresponding bit, such that analog input signal $V_{IN}$ represents a value equivalent to the thermometer-coded output of decoder 20.

Turning back to FIG. 2, DAC 14 may supply analog input signal $V_{IN}$ to an amplifier 16 which may amplify or attenuate analog signal $V_{IN}$ to provide an output signal $V_{OUT}$, which may operate a speaker, a headphone transducer, a line level signal output, and/or other suitable transducer. Although shown in FIG. 2 as a differential signal, in some embodiments, output signal $V_{OUT}$ may be a single-ended signal. In some embodiments, DAC 14 may be an integral component of amplifier 16.

Also as shown in FIG. 2, IC 9 may include a test signal generator 10 that, during a calibration operation, generates a test signal that is processed by delta-sigma modulator 12 and DAC elements 22 of DAC 14. As described in greater detail below, a matching signal generator may be present in a calibration subsystem external to IC 9, wherein such matching signal generator generates a matching signal that matches the signal generated by the test signal generator and that is seen by DAC elements 22.

Although FIGS. 1 and 2 depict an IC 9 for driving an audio transducer with a current-mode signal, it is understood that an IC similar or identical to IC 9 may be used to convert any suitable digital signal into a suitable output current signal for driving any suitable transducer, including non-audio transducers such as a linear resonant actuator or other suitable transducer. Further, the systems and methods described herein are not limited to mobile audio devices, and may also be used in video game controllers, touchscreens, automobiles, and any other device for which audio and/or haptic output is desirable.

Figure 4:
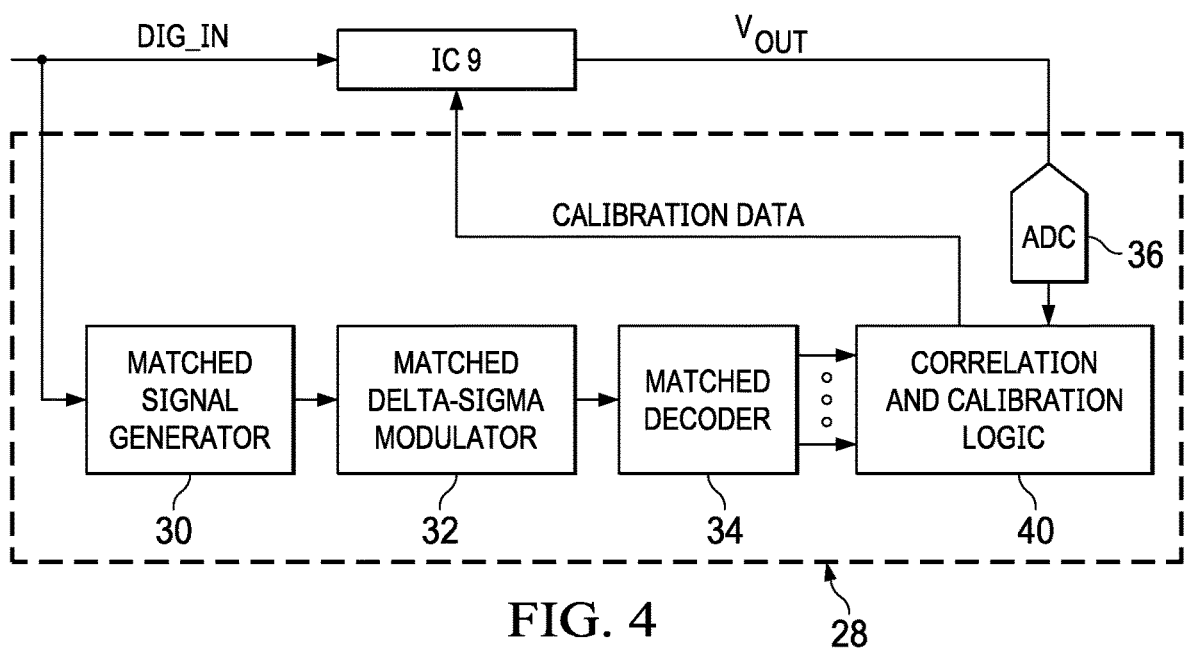
FIG. 4 is a block diagram of a system for calibrating the IC depicted in FIG. 2, in accordance with embodiments of the present disclosure.

FIG. 4 is a block diagram of a calibration system interfaced to and configured to calibrate IC 9, in accordance with embodiments of the present disclosure. As shown in FIG. 4, calibration subsystem 28 may include a signal generator 30 matched to test signal generator 10, a delta-sigma modulator 32 matched to delta-sigma modulator 12, a matched decoder 30 matched to decoder 20, an analog-to-digital converter (ADC) 36 configured to convert analog output signal VOUT into an equivalent digital signal, and correlation and calibration logic 40.

In operation, during a calibration operation, test signal generator 10 and matched signal generator 30 may generate matching test signals matched to bit accuracy, and may be synchronized to one another at the start of the calibration operation. For example, a signal SYNC, which may be derived by a synchronizer 18 from a data stream of digital input signal DIG_IN or provided by a separate control signal to IC 9, may indicate synchronization to test signal generator 10. Test signal generator 10 and matched signal generator 30 may, for example, generate matching, synchronized sine waves of selectable frequency and amplitude, or multi-tone signals, which may allow for faster calibration.

Matched delta-sigma modulator 32 may in turn generate a quantized signal matched to quantized signal QUANT generated by delta-sigma modulator 12, and matched decoder 34 may generate signals matched to signals (e.g., thermometer-coded signals) that drive DAC elements 22. Thus, the driving signals to individual DAC elements 22 may be known without direct observation.

Correlation and calibration logic 40 may correlate the signals generated by matched decoder 34 to the digital equivalent to analog output voltage $V_{OUT}$ generated by ADC 36, and based on such correlation, generate calibration data for calibrating IC 9 to compensate for noise, distortion, non-linearity, and/or other undesirable characteristics. Such correlation and generation of calibration data based on the correlation are beyond the scope of this disclosure, but may be implemented in any suitable manner, including in a manner similar or identical to that of the '569 patent. Although not shown in the FIGURES, the calibration data may be stored within IC 9 or a memory accessible by IC 9, such that the calibration data may be used to calibrate operation of IC 9.

In order to synchronize the matched test signals generated by each of test signal generator 10 and matched signal generator 30, test signal generator 10 and matched signal generator 30 may receive a control signal indicative of synchronization (e.g., signal SYNC shown in FIG. 2). However, in some embodiments, test signal generator 10 and matched signal generator 30 may be configured to determine a bit synchronization based on a data stream of digital input signal DIG_IN. For example, in a serial, three-level interface, test signal generator 10 and matched signal generator 30 may be configured to synchronize upon an occurrence of a particular value in the data stream of digital input signal DIG_IN (e.g., +1), assuming state variables of delta-sigma modulators 12 and 32 have already been reset.

In order to reset the state variables, in some embodiments, IC 9 and calibration subsystem 28 may receive a control signal indicative of a reset (e.g., signal RESET shown in FIG. 2). However, in some embodiments, IC 9 and calibration subsystem 28 may be configured to reset their state variables based on a data stream of digital input signal DIG_IN. For example, in some embodiments, IC 9 and calibration subsystem 28 may be configured to reset their state variables upon an occurrence of a particular bit sequence in the data stream of digital input signal DIG_IN (e.g., eight consecutive "1" bits). The occurrence of such reset may also begin synchronization of test signal generator 10 and matched signal generator 30.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An open-loop digital-to-analog converter (DAC) circuit, comprising:
    a delta-sigma modulator;
    a decode block responsive to the delta-sigma modulator configured to perform a DAC decode operation;
    a plurality of DAC elements responsive to the DAC decode operation;
    an analog output driver responsive to the plurality of DAC elements;
    a test signal generator configured to generate a test signal that is responsive to an input of the delta-sigma modulator; and
    a synchronizer configured to enable replication of the test signal at an external test system coupled to the open-loop DAC circuit in order to generate a matching test signal at the external test system that matches the test signal generated by the test signal generator.

2. The open-loop DAC circuit of claim 1, wherein the synchronizer is configured to synchronize the test signal and the matching test signal by a synchronization signal based on an input signal to the open-loop DAC circuit.

3. The open-loop DAC circuit of claim 1, wherein the synchronizer is configured to synchronize the test signal and the matching test signal by a synchronization signal on which an initial embedded reset is performed and which then starts synchronization of the test signal and the matching test signal.

4. The open-loop DAC circuit of claim 1, wherein the external test system further comprises:
 a matched delta-sigma modulator matched to the delta-sigma modulator and responsive to the matching test signal; and
 a matched decode block matched to the decode block and responsive to the matched delta-sigma modulator and configured to perform a second DAC decode operation matched to the DAC decode operation.

5. The open-loop DAC circuit of claim 4, wherein the external test system further comprises correlation and calibration logic to:
 perform a correlation of an output generated by an analog output driver to an output of the matched decode block; and
 based on the correlation, generate calibration data for calibration of the open-loop DAC circuit.

6. The open-loop DAC circuit of claim 4, wherein the synchronizer is configured to reset and synchronize the delta-sigma modulator and the matched delta-sigma modulator.

7. A method comprising, in an open-loop digital-to-analog converter (DAC) circuit having a delta-sigma modulator, a decode block responsive to the delta-sigma modulator configured to perform a DAC decode operation, a plurality of DAC elements responsive to the DAC decode operation, and an analog output driver responsive to the plurality of DAC elements:
 generating a test signal that is responsive to an input of the delta-sigma modulator; and
 enabling replication of the test signal at an external test system coupled to the open-loop DAC circuit in order to generate a matching test signal at the external test system that matches the test signal.

8. The method of claim 7, further comprising synchronizing the test signal and the matching test signal by a synchronization signal based on an input signal to the open-loop DAC circuit.

9. The method of claim 7, further comprising synchronizing the test signal and the matching test signal by a synchronization signal on which an initial embedded reset is performed and which then starts synchronization of the test signal and the matching test signal.

10. The method of claim 7, wherein the external test system further comprises:
 a matched delta-sigma modulator matched to the delta-sigma modulator and responsive to the matching test signal; and
 a matched decode block matched to the decode block and responsive to the matched delta-sigma modulator and configured to perform a second DAC decode operation matched to the DAC decode operation.

11. The method of claim 10, wherein the external test system further comprises correlation and calibration logic to:
 perform a correlation of an output generated by an analog output driver to an output of the matched decode block; and
 based on the correlation, generate calibration data for calibration of the open-loop DAC circuit.

12. The method of claim 10, further comprising resetting and synchronizing the delta-sigma modulator and the matched delta-sigma modulator.

13. An external test system for an open-loop digital-to-analog converter (DAC) circuit having a delta-sigma modulator, a decode block responsive to the delta-sigma modulator configured to perform a DAC decode operation, a plurality of DAC elements responsive to the DAC decode operation, an analog output driver responsive to the plurality of DAC elements, a test signal generator configured to generate a test signal that is responsive to an input of the delta-sigma modulator, and a synchronizer configured to enable replication of the test signal at an external test system coupled to the open-loop DAC circuit in order to generate a matching test signal at the external test system that matches the test signal generated by the test signal generator, wherein the external test system comprises:
 a matched delta-sigma modulator matched to the delta-sigma modulator and responsive to the matching test signal; and
 a matched decode block matched to the decode block and responsive to the matched delta-sigma modulator and configured to perform a second DAC decode operation matched to the DAC decode operation.

14. The external test system of claim 13, further comprising correlation and calibration logic to:
 perform a correlation of an output generated by an analog output driver to an output of the matched decode block; and
 based on the correlation, generate calibration data for calibration of the open-loop DAC circuit.

15. The external test system of claim 13, wherein the synchronizer is configured to reset and synchronize the delta-sigma modulator and the matched delta-sigma modulator.

16. A method for an external test system for an open-loop digital-to-analog converter (DAC) circuit having a delta-sigma modulator, a decode block responsive to the delta-sigma modulator configured to perform a DAC decode operation, a plurality of DAC elements responsive to the DAC decode operation, an analog output driver responsive to the plurality of DAC elements, a test signal generator configured to generate a test signal that is responsive to an input of the delta-sigma modulator, and a synchronizer configured to enable replication of the test signal at an external test system coupled to the open-loop DAC circuit in order to generate a matching test signal at the external test system that matches the test signal generated by the test signal generator, wherein the method comprises:
 matching a matched delta-sigma modulator to the delta-sigma modulator and responsive to the matching test signal; and
 matching a matched decode block to the decode block and responsive to the matched delta-sigma modulator and configured to perform a second DAC decode operation matched to the DAC decode operation.

17. The method of claim 16, further comprising:
 performing a correlation of an output generated by an analog output driver to an output of the matched decode block; and
 based on the correlation, generating calibration data for calibration of the open-loop DAC circuit.

18. The method of claim 16, wherein the synchronizer is configured to reset and synchronize the delta-sigma modulator and the matched delta-sigma modulator.

\* \* \* \* \*